United States Patent [19]

Long

[11] 3,769,605

[45] Oct. 30, 1973

[54] FEEDBACK AMPLIFIER CIRCUIT

[75] Inventor: Gordon D. Long, Portland, Oreg.

[73] Assignee: Tektronix, Inc., Beaverton, Oreg.

[22] Filed: Feb. 18, 1972

[21] Appl. No.: 227,370

Related U.S. Application Data

[63] Continuation of Ser. No. 731,097, May 22, 1968, abandoned.

[52] U.S. Cl. .................... 330/30 D, 330/24, 330/69, 330/51

[51] Int. Cl. .................... H03f 3/68

[58] Field of Search .................... 330/26, 30 D, 69

[56] References Cited

UNITED STATES PATENTS

| | | | |
|---|---|---|---|
| 3,668,543 | 6/1972 | Bailey | 330/26 X |
| 3,638,132 | 1/1972 | Trilling | 330/69 |

*Primary Examiner*—Nathan Kaufman
*Attorney*—John P. Dellett

[57] ABSTRACT

A feedback amplifier circuit comprises a high gain amplifier and a negative feedback path including a current source means, e.g. a high output impedance isolation device, for providing feedback current to the amplifier input. In a differential amplifier embodiment, a pair of high output impedance feedback isolation devices provide current to an input impedance means connected between the circuit input terminals. The circuit is largely independent of input voltage level and impedance, and as a result, the aforementioned input impedance means can be varied for changing gain while maintaining a high degree of common mode rejection.

12 Claims, 5 Drawing Figures

PATENTED OCT 30 1973

3,769,605

GORDON D. LONG
*INVENTOR*

*BY*

*BUCKHORN, BLORE, KLARQUIST & SPARKMAN*
*ATTORNEYS*

FEEDBACK AMPLIFIER CIRCUIT

This is a continuation of application Ser. No. 731,097 filed May 22, 1968, and now abandoned.

BACKGROUND OF THE INVENTION

Generally speaking, an operational amplifier is a device which, by means of negative feedback, is capable of processing a signal with a reasonably high degree of accuracy. It includes a high gain amplifier designed to remain stable with large amounts of negative feedback from the output to the input. Because of the high accuracy of the amplifier, it finds wide use in measuring instruments, computers, and the like.

A differential amplifier circuit comprising a pair of differentially connected operational amplifiers can be designed to provide a high degree of common mode rejection, that is, rejection of an in-phase signal applied to both differential input terminals. However, in the usual differential operational amplifier circuit, as in a single phase operational amplifier circuit, the accuracy of the output and the rejection of unwanted signals is to a certain degree dependent upon input voltage level and impedance. As a result, unwanted outputs may be produced, and moreover, change of circuit gain by means of single circuit control is hindered.

SUMMARY OF THE INVENTION

In accordance with the present invention, an operational amplifier or feedback circuit comprises a high gain amplifier for receiving the circuit input and for providing an output in response thereto. The circuit further comprises a negative feedback path including a current source means responsive to the output of the high gain amplifier, wherein the current source means has a high output impedance. The current source means supplies a current proportional to the output of the high gain amplifier for coupling as an in phase signal to an inverting input of the high gain amplifier, and has the effect of rendering the output of the overall circuit largely independent of input voltage level and impedance. The current source means suitably comprises a high output impedance isolation and/or amplification device, and in particular may comprise a common base connected transistor amplifier stage. In a differential amplifier embodiment, current source means are included in the feedback path for a pair of differentially related high gain amplifiers and as a result, a circuit is provided having excellent common mode rejection even when the gain of the circuit is altered by varying the value of an input impedance means.

It is accordingly an object of the present invention to provide an improved feedback amplifier circuit having an output largely independent of input voltage level and impedance.

It is a further object of the present invention to provide an improved differential amplifier circuit having inherent common mode rejection.

It is another object of the present invention to provide an improved variable gain differential amplifier circuit retaining good common mode rejection.

The subject matter which I regard as my invention is particularly pointed out and distinctly claimed in the concluding portion of this specification. The invention, however, both as to organization and method of operation, together with further advantages and objects thereof, may best be understood by reference to the following description taken in connection with the accompanying drawings wherein like reference characters refer to like elements.

DRAWINGS

DETAILED DESCRIPTION

Figure 1:
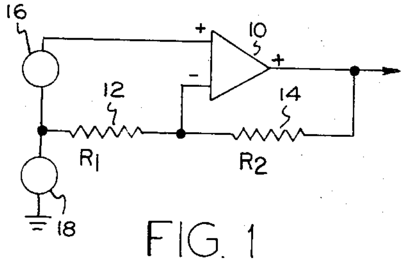
FIG. 1 is a schematic diagram of an operational amplifier including a high gain amplifier with negative feedback.

Referring to FIG. 1, a conventional operational or feedback circuit includes a high gain amplifier 10, here provided with both noninverting and inverting inputs indicated by a plus sign and a minus sign, respectively. One terminal of an input signal source 16 is connected to the noninverting input and the other terminal of source 16 is coupled to the inverting input through an input impedance means comprising a resistor 12 having a value of $R_1$.

The output of amplifier 10 is coupled to the inverting input thereof through a feedback means, here comprising a resistor 14 having a value of $R_2$, while a second source, 18, is coupled between source 16 and ground. The operational amplifier circuit seeks to balance the inputs to high gain amplifier 10, effectively bringing the net amplifier 10 input to zero, through feedback. This circuit is intended to provide an output which is closely proportional to the input signal from source 16. Thus, in the FIG. 1 circuit, the output voltage is intended to be $e_o = [(R_1 + R_2)/R_1]\ e_{in}$, where $e_{in}$ is the signal from source 16. However, it will be apparent that if a source 18 causes a current through resistor 12, the output will be affected thereby and will no longer be merely a function of the signal from source 16, but rather the output will now also be a function of the voltage drop produced by the current from source 18 in resistor 12.

Figure 2:
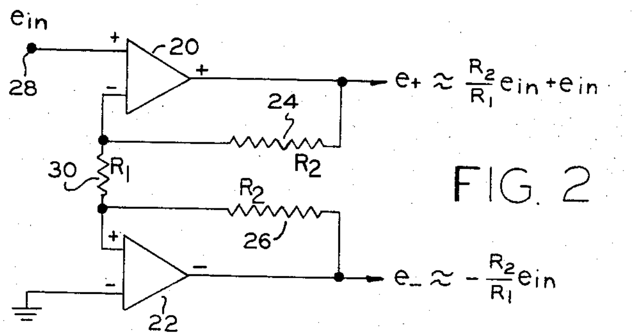
FIG. 2 is a schematic diagram of a differential amplifier including a pair of high gain amplifiers.

A similar problem is exemplified by the case of a differential amplifier circuit such as the one illustrated in FIG. 2. Referring to FIG. 2, such circuit includes first and second high gain amplifiers 20 and 22, each provided with both inverting and noninverting inputs. circuit input terminal 28 is connected to the noninverting input of amplifier 20 while the output of amplifier 20 is coupled to the inverting input through a negative feedback impedance comprising resistor 24. The noninverting input of amplifier 22 (here indicated by a minus sign) is in this instance grounded, and the output of amplifier 22 is coupled to the inverting (+) input through a negative feedback impedance comprising resistor 26. An input impedance means, consisting of resistor 30, is coupled between the inverting inputs of amplifiers 20 and 22. The value of resistor 30 is $R_1$, while the values of resistors 24 and 26 are each $R_2$. The output of amplifier 22, $e_- \approx -(R_2/R_1)\ e_{in}$. The output of amplifier 20, $e_+ \approx (R_2/R_1)\ e_{in} + e_{in}$.

The input of the FIG. 2 circuit is completely unbalanced, but nevertheless it would be desired that a balanced output be produced. However, it is seen that an extra "$e_{in}$" occurs in the output of amplifier 20, representing the transmission of a common mode signal. The difference in output from amplifier 20 as compared with amplifier 22 is, of course, attributable to the voltage drop, $e_{in}$, across resistor 30, the input impedance means.

For given predetermined values of resistors 24, 26, and 30, the undesired differential in the output can be corrected. For example, the value of resistor 24 may be made slightly smaller. However, the value of resistor 30 cannot then be changed without unbalancing the circuit, although it would be desirable to be able to change the gain of the circuit by varying the value of resistor 30. Such change cannot be made without reintroducing a common mode output signal, unless the values of one or more other components are also varied.

Figure 3:
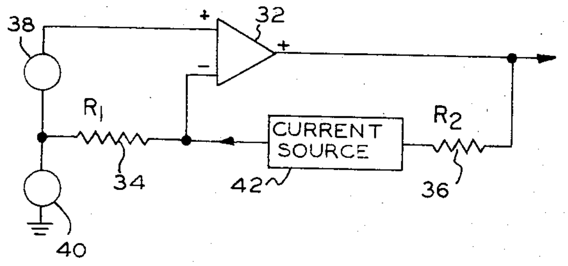
FIG. 3 is a schematic diagram of a feedback amplifier circuit according to the present invention exhibiting an output largely independent of input voltage level and impedance.

FIG. 3 schematically illustrates a circuit according to the present invention including a high gain amplifier 32 having an input signal source 38 coupled thereto. A first terminal of input source 38 is connected to the noninverting input of the high gain amplifier 32, and the remaining terminal of source 38 is coupled to the inverting input of amplifier 32 through an input impedance means comprising resistor 34 having a value of $R_1$. A second signal source 40 is interposed between the said remaining terminal of source 38 and ground.

The output terminal of amplifier 32 is coupled through a feedback impedance comprising resistor 36, having a value $R_2$, to the input of current source means 42, the output of which is applied at the inverting input of amplifier 32. Resistor 36 and current source means 42 together form a feedback path. Current source means 42 suitably comprises a high output impedance isolation device such as a common base connected transistor, as hereinafter more fully illustrated in connection with the FIG. 5 embodiment. The current source means has a very high output impedance, and the current supplied thereby is substantially the only current passing through, and producing a voltage drop across, resistor 34. Because of the high output impedance of current source means 42, source 40 can no longer produce substantial voltage drop across resistor 34, and therefore the effect of source 40 is substantially nullified. The output of the FIG. 3 circuit is substantially a function of the input signal from source 38 and is substantially independent of input voltage level, as represented by source 40, as well as being substantially independent of input impedance.

Figure 4:
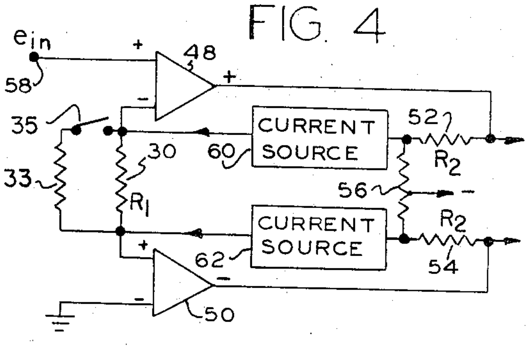
FIG. 4 is a schematic diagram of a differential amplifier circuit according to the present invention exhibiting high common mode rejection and having a provision for changing the gain thereof by means of a single control.

FIG. 4 illustrates a differential amplifier embodiment of the present invention including high gain amplifiers 48 and 50 wherein an input signal $e_{in}$ is provided at terminal 58 connected to the noninverting input of amplifier 48, while the noninverting input of amplifier 50 is grounded. A feedback resistor 52 couples the output of amplifier 48 to the input of a current source means 60. Current source means 60, which may comprise a high output impedance isolation device, has its high output impedance terminal coupled to the inverting input of amplifier 48 as well as to one end of input impedance means 30. Similarly, a feedback impedance means comprising resistor 54 couples the output of amplifier 50 to the input of a current source means 62, which may comprise a high output impedance isolation device. The high impedance output of current source means 62 is coupled to the inverting input terminal of amplifier 50 as well as to the remaining end of input impedance means 30. Feedback resistor 52 and current source means 60 form a feedback path for amplifier 48 while feedback resistor 54 and current source means 62 provide a feedback path for amplifier 50. A resister 33 is selectively connected across resistor 30 by means of switch 35 for effectively changing the value of the input impedance means in order to change the gain of the circuit. A bias current source means 56, which is connected to a negative voltage point, provides a source of power for current source means 60 and 62.

As in the previous embodiment, the current source means 60 and 62 control the current in resistor 30 so that a balanced output is produced, whereby substantially no common mode signal is transmitted despite the unbalanced input, here taken with respect to ground. The gain of the circuit may be changed by shunting resistor 30 with resistor 33 through closure of switch 35 without unbalancing the circuit. The current sources, because of their high output impedance, provide no effective return path for a common mode input, and therefore no extraneous voltage drop takes place across resistor 30. Thus, as in the previous embodiment, the FIG. 4 circuit is largely independent of input voltage level and source impedance.

Figure 5:
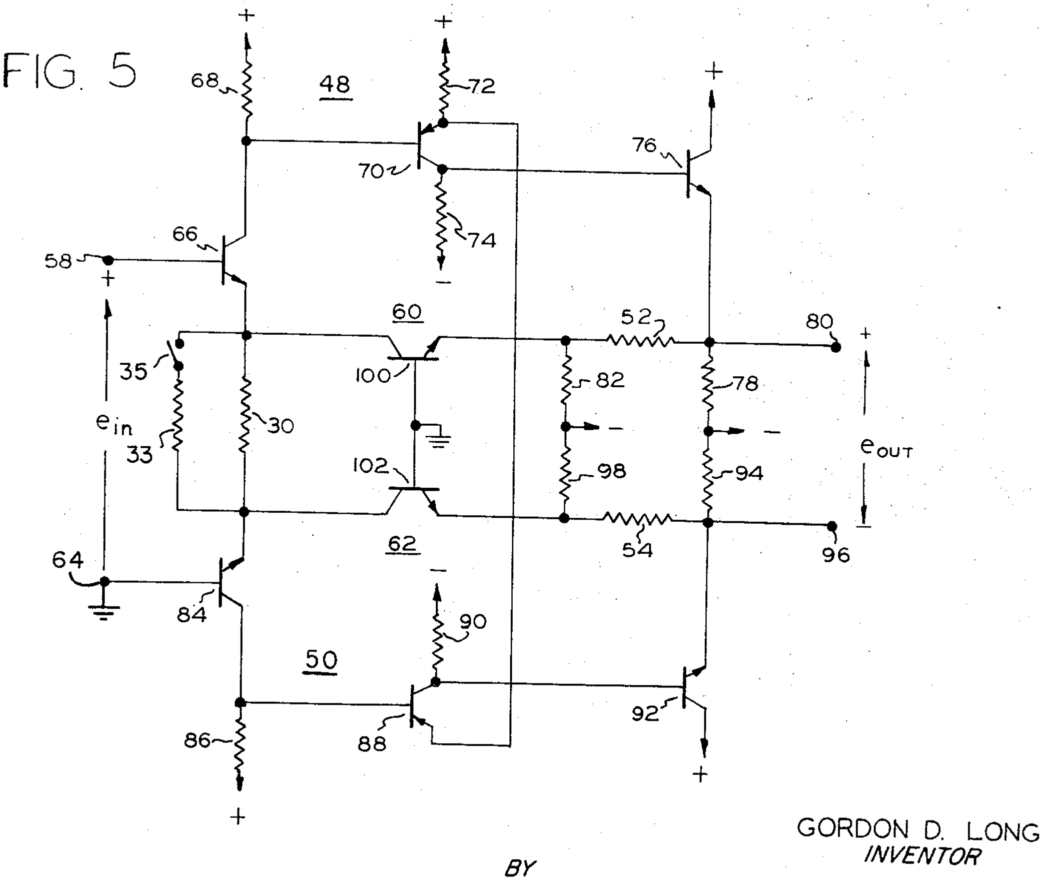
FIG. 5 is a more detailed schematic diagram for the circuit illustrated in FIG. 4.

The FIG. 4 circuit is illustrated in greater detail in FIG. 5 wherein like elements are referred to with like reference numerals. In the embodiment as illustrated, a first high gain amplifier 48 comprises a first common emitter connected transistor amplifier stage including transistor 66 having its base connected to input terminal 58, with its collector being returned to a positive voltage point through load resistor 68. Transistor 66 is disposed in cascaded relation with a second common emitter connected transistor amplifier stage comprising transistor 70 having its base connected to the collector of transistor 66 and having its emitter returned to a positive voltage through resistor 72. The net effect of cascaded stages 66 and 70 is a high gain output without signal inversion. The collector of transistor 70 is coupled through load resistor 74 to a negative voltage and to the base of emitter-follower transistor 76 having its emitter connected to output terminal 80.

High gain amplifier 50 includes a grounded input terminal 64 connected to the base of transistor 84 in a common emitter connected transistor amplifier stage. The collector of transistor 84 is connected to a positive voltage through load resistor 86 and is also connected in cascaded driving relation to the base of transistor 88 forming part of a common emitter connected amplifier stage. The emitter of transistor 88 is connected to the emitter of transistor 70, and the collector of transistor 88 is returned to a negative voltage through load resistor 90. The cascaded stages comprising transistors 84 and 88 provide high gain without signal inversion. Also, the collector of transistor 88 is connected in driving relation to the base of emitter-follower transistor 92, the emitter of which is connected to output terminal 96. Resistors 78 and 94 provide operating bias to transistors 76 and 92 by connection to a negative voltage point.

Current source means 60 and 62 here comprise common base connected transistors 100 and 102 having their bases grounded. The emitter of transistor 100 is connected to the end of feedback resistor 52 remote from output terminal 80 while the emitter of transistor 102 is similarly connected to the end of feedback resistor 54 remote from output terminal 96. A second bias network comprising resistors 82 and 98 is employed to return the emitters of transistors 100 and 102 to a negative voltage point. It should be noted that the latter power connection has substantially no effect on circuit operation or the balance of the circuit because of the isolating nature and low impedance of current source transistors 100 and 102. The collectors of transistors 100 and 102 are connected to inputs of transistors 66 and 84 respectively, these inputs here comprising the emitter electrodes thereof. As will be understood by those skilled in the art, the emitter electrodes provide inverting input terminals for high gain amplifiers 48 and 50, while the base terminals of transistors 66 and 84 respectively comprise noninverting input terminals.

The FIG. 5 circuit is found advantageous in driving a load requiring sizable current because of utilization of emitter-follower transistors 76 and 92, but it is appreciated that these transistors are not necessary to the operation of the circuit. The circuit operates in substantially the same manner mentioned in connection with the previous embodiments, the high impedance current source outputs of transistors 100 and 102 dominantly controlling the feedback to such an extent that extraneous voltage levels are relatively ineffective in causing circuit imbalance. Therefore, the common mode rejection is considerably enhanced. Also, it should be noted that first order base-emitter thermal effects of the stages comprising transistors 66 and 84 do not cause common mode change at the output.

Current sources 60 and 62 comprising transistors 100 and 102 respectively in FIG. 5 have low input impedance. Therefore a feedback resistor, 52 or 54, can accurately convert the output voltage to a proportional current. These resistors may thus each have a value substantially equaling the feedback resistance value $R_2$ as hereinbefore discussed.

The common connection of the emitters of transistors 70 and 88 also assists common mode rejection. In the case of a common mode signal, the gain of the stage comprising transistor 70, for example, is determined by the ratio of the resistance of resistor 74 to twice the resistance of resistor 72. However, for a push-pull signal component, the gain of the stage is determined by the ratio of the resistance of resistor 74 to the emitter impedance of transistor 70. The common mode rejection attributable to this connection is not as great as that contributed by the current source feedback, but is nevertheless advantageously included.

While I have shown and described preferred embodiments of my invention, it will be apparent to those skilled in the art that many changes and modifications may be made without departing from my invention in its broader aspects. I therefore intend the appended claims to cover all such changes and modifications as fall within the spirit and scope of my invention.

I claim:

1. A differential feedback amplifier circuit for providing a selectable output largely independent of input voltage level and impedance and therefore having high common mode rejection comprising:

a pair of relatively oppositely poled input terminals between which the input of said circuit is presented;

first and second high gain amplifiers having first inputs coupled respectively to the relatively oppositely poled input terminals and having negative feedback inputs, said amplifiers providing a common differential output between respective output terminals thereof which output terminals respectively supply relatively oppositely poled output values substantially 180 degrees out of phase with one another;

negative feedback path means for providing negative feedback for said circuit, said means including current source means responsive to output values provided by said high gain amplifiers, said current source means having a high output impedance and providing current proportional to said output values for coupling to said negative feedback inputs of said high gain amplifiers;

and selectable common impedance means coupled between said negative feedback inputs of said first and second high gain amplifiers for selecting the gain of said amplifier circuit.

2. The circuit according to claim 1 wherein said negative feedback transistor means comprises first and second current source means, the first current source means having a high output impedance and providing a current proportional to the output of the first high gain amplifier for coupling to an input of said first high gain amplifier;

the second current source means being responsive to the output of the second high gain amplifier, said second current source means having a high output impedance and providing a current proportional to the output of the second high gain amplifier for coupling to an input of the second high gain amplifier;

and wherein said selectable common input impedance means is coupled between the inputs of said high gain amplifiers to which the first and second current source means are coupled.

3. The circuit according to claim 2 wherein each of said high gain amplifiers is provided with inverting and noninverting inputs, said current source means being coupled to inverting inputs, and said input terminals being coupled to noninverting inputs.

4. The circuit according to claim 2 wherein said selectable common input impedance means is provided with a shunting circuit, said shunting circuit comprising a second impedance and a switch in series therewith.

5. The circuit according to claim 2 wherein each current source means comprises a high output impedance isolation device.

6. The circuit according to claim 2 wherein each current source means comprises a common base connected transistor.

7. The circuit according to claim 2 further including feedback impedance means coupled between the output of each high gain amplifier and the respective current source means providing an output proportional thereto.

8. The circuit according to claim 2 wherein each high gain amplifier comprises first and second cascaded common emitter connected amplifier stages;

and wherein each current source means comprises a common base connected transis.or having its collector connected to the emitter of the corresponding first cascaded transistor amplifier stage;

said selectable common input impedance means being coupled between the emitters of the first cascaded transistor amplifier stages of the high gain amplifiers;

and a feedback impedance coupling the emitter of each common base connected transistor to the corresponding output of the corresponding high gain amplifier.

9. The circuit according to claim 8 further including bias resistors coupled between said feedback impedances for connection to a power source.

10. The circuit according to claim 8 further including a common emitter resistor for the second common emitter connected amplifier stages of said amplifiers.

11. Differential amplifier AMPLIFIER apparatus comprising:

a first plurality of cascaded stages;

a second plurality of cascaded stages;

each stage of said first and second plurality including a transistor with an emitter, collector and base;

said first and second plurality of cascaded stages formed by operatively connecting the collector of one stage to the base of the following stage;

selectable common impedance means for selecting the gain of said amplifier connected at one end thereof to said emitter of the first stage of said first plurality of cascaded stages and connected at the other end thereof to said emitter of the first stage of the second plurality of cascaded stages;

bias means operatively connected to selected transistor electrodes for providing bias signals thereto; and circuit means for providing current isolated feedback signals having a pair of input leads respectively coupled to said collectors of the last stage of said first and second plurality of cascaded stages and a pair of output leads respectively connected to said first stage emitters, said circuit means further including a pair of active elements connected in push-pull, each having an input respectively coupled to said circuit means input leads and an output operatively coupled respectively to said circuit means output leads.

12. Differential amplifier apparatus comprising:

a first plurality of cascaded stages and a second plurality of cascaded stages disposed in differential relation with the first plurality, said first and second plurality of cascaded stages respectively having first and second output terminals adapted for driving a load;

each stage of the first and second plurality including a transistor with an emitter, collector and base;

selectable common impedance means for selecting the gain of said amplifier connected at one end thereof to said emitter of the first stage of said first plurality of cascaded stages and connected at the other end thereof to said emitter of the first stage of the second plurality of cascaded stages;

bias means operatively connected to selected transistor electrodes for providing bias signals thereto; and circuit means for providing feedback signals having a pair of input leads respectively connected to receive an output signal from each of said first and second output terminals of said first and second plurality of cascaded stages and a pair of output leads respectively connected to said first stage emitters, said circuit further including a pair of push-pull connected active elements each having an input respectively coupled to said circuit means input leads and each having an output operatively coupled respectively to said circuit means output leads.

* * * * *

UNITED STATES PATENT OFFICE
CERTIFICATE OF CORRECTION

Patent No. 3,769,605 Dated October 30, 1973

Inventor(s) Gordon D. Long

It is certified that error appears in the above-identified patent and that said Letters Patent are hereby corrected as shown below:

Column 3, line 1, "of" should be --to--.

Column 6, line 23, "transistor" should be --path--.

Column 7, line 15, delete "AMPLIFIER".

Signed and sealed this 19th day of February 1974.

(SEAL)
Attest:

EDWARD M. FLETCHER, JR.
Attesting Officer

C. MARSHALL DANN
Commissioner of Patents